United States Patent [19]

Armbruster

[11] Patent Number: 5,774,194
[45] Date of Patent: Jun. 30, 1998

[54] TERRESTRIAL AND SATELLITE TELEVISION RECEPTION TUNER

[75] Inventor: Veit Armbruster, Georgen, Germany

[73] Assignee: Deutsche Thomson-Brandt GmbH, Villingen-Schwenningen, Germany

[21] Appl. No.: 535,110

[22] PCT Filed: May 25, 1994

[86] PCT No.: PCT/EP94/01676

§ 371 Date: Feb. 28, 1996

§ 102(e) Date: Feb. 28, 1996

[87] PCT Pub. No.: WO94/29949

PCT Pub. Date: Dec. 22, 1994

[30] Foreign Application Priority Data

Jun. 3, 1993 [DE] Germany ............................ 43 18 276.3
Aug. 17, 1993 [DE] Germany ............................ 43 27 631.8

[51] Int. Cl.[6] .............................. H04N 5/455; H04N 7/20
[52] U.S. Cl. ................................ 348/726; 348/73; 348/11; 455/32; 455/133; 455/141; 455/209; 455/314
[58] Field of Search .................................. 348/6, 10, 11, 348/706, 726, 731, 735, 733, 555, 725; 455/3.2, 6.1, 133, 141, 209, 314, 337; H04N 5/455, 7/20, 5/44

[56] References Cited

U.S. PATENT DOCUMENTS

| | | | |
|---|---|---|---|
| 4,417,279 | 11/1983 | Shinkawa et al. | 348/725 |
| 4,633,315 | 12/1986 | Kasperhovitz | 348/726 |
| 4,748,684 | 5/1988 | Wright, Jr. | 348/735 |
| 4,939,789 | 7/1990 | Sakashita et al. | 348/733 |
| 5,010,400 | 4/1991 | Oto | 348/11 |
| 5,243,415 | 9/1993 | Vance | 455/6.1 |
| 5,272,534 | 12/1993 | Vromans et al. | 348/725 |
| 5,437,051 | 7/1995 | Oto | 348/731 |

FOREIGN PATENT DOCUMENTS

| | | | |
|---|---|---|---|
| 0276144 | 7/1988 | European Pat. Off. | H03D 5/00 |
| 0401932 | 12/1990 | European Pat. Off. | H04N 7/20 |
| 61-156906 | 7/1986 | Japan | H03D 5/00 |
| 2-274022 | 11/1990 | Japan | H04B 1/18 |

OTHER PUBLICATIONS

Patent Abstracts of Japan, vol. 10, No. 359, 3 Dec. 1986 and Japanese Pat. No. 61–156906 (Matsushita Electric Ind. Co. Ltd.).

Patent Abstracts of Japan, vol. 15, No. 36, 29 Jan. 1991 and Japanese Pat. No. 2–274022 (Matsushita Electric Ind. Co. Ltd.).

*Primary Examiner*—John K. Peng
*Assistant Examiner*—Jeffrey S. Murrell
*Attorney, Agent, or Firm*—Joseph S. Tripoli; Frederick A. Wein; Peter M. Emanuel

[57] ABSTRACT

A tuner is used in common for both terrestrial and satellite television reception. A second mixing stage is switched as a mixer for signal conversion into a second intermediate frequency during terrestrial television reception and is switched as a component of a FM-PLL demodulator during satellite television reception. The tuner is particularly suitable for television receivers and video recorders which receive signals from both a terrestrial antenna/signal source and from a satellite antenna/signal source.

6 Claims, 2 Drawing Sheets

TERRESTRIAL AND SATELLITE TELEVISION RECEPTION TUNER

BACKGROUND

The invention is based on a television tuner. In such a tuner, for terrestrial reception, a conversion to a 1st IF is in general carried out in a first mixing stage and a further conversion to a 2nd IF is carried out in a subsequent second mixing stage, which 2nd IF is then supplied to the IF amplifier. Conversion to an IF is likewise carried out in a first mixing stage for satellite reception. This IF is then supplied to an FM-PLL demodulator which supplies at its output the baseband signal of the satellite antenna signal. Two separate tuners are in general provided for the two different functions, specifically terrestrial reception and satellite reception.

The invention is based on the object of providing a common tuner for terrestrial reception and satellite reception, which requires only a low circuit cost overall and in which as many components as possible are used for both operating modes.

The invention is based on the following considerations and knowledge. For terrestrial reception, the first mixing stage and the second mixing stage for the double frequency conversion work up to the intermediate frequencies of 38.9 MHz and 33.4 MHz. For satellite reception, only the first mixing stage works as a frequency converter, since the baseband signal of the satellite antenna signal is obtained from the IF carrier, whose frequency has been reduced only once, directly in a PLL demodulator. In the case of invention, the second mixing stage is now used as a component of the PLL demodulator for satellite reception, to be precise preferably as a phase comparison stage of the PLL circuit. In this case, the mixing oscillator for the second mixing stage is preferably tuned to the first intermediate frequency. This double use of the second mixing stage, specifically as the second mixing stage for terrestrial reception for the second frequency conversion and as a phase comparison stage of the PLL demodulator for satellite reception, results in a lower circuit cost. A tuner is thus produced which can receive the antenna signal of a conventional terrestrial antenna and the antenna signal of a satellite antenna equally well.

The output of the second mixing stage is preferably connected via a changeover switch to the input of a second IF stage for terrestrial reception and to the input of a low-pass filter for satellite reception, the output of which low-pass filter is connected to the control input of the mixing oscillator for the second mixing stage and to a terminal which supplies the baseband signal. The control input of the mixing oscillator is in this case connected via a changeover switch to the output of a PLL circuit, which is controlled by the mixing oscillator and by an I²C bus, for terrestrial reception and is connected to the output of the low-pass filter of the PLL circuit for satellite reception. The tuner preferably has a first input for a satellite antenna signal whose frequency has been reduced and a second input for a terrestrial antenna signal. The two inputs can also be combined to form one input. An antenna signal would then be supplied thereto which has already been combined in advance, for example in the vicinity of the antennas, from the antenna signal of the terrestrial antenna and that of the satellite antenna. The tuner preferably has a first output for the second intermediate frequency of a terrestrial antenna signal, and has a second output for the baseband signal of a satellite antenna signal.

BRIEF DESCRIPTION OF THE DRAWINGS

The invention is explained in the following text with reference to the drawing of an exemplary embodiment.

DETAILED DESCRIPTION OF THE PREFERRED EMBODIMENTS

Figure 1:
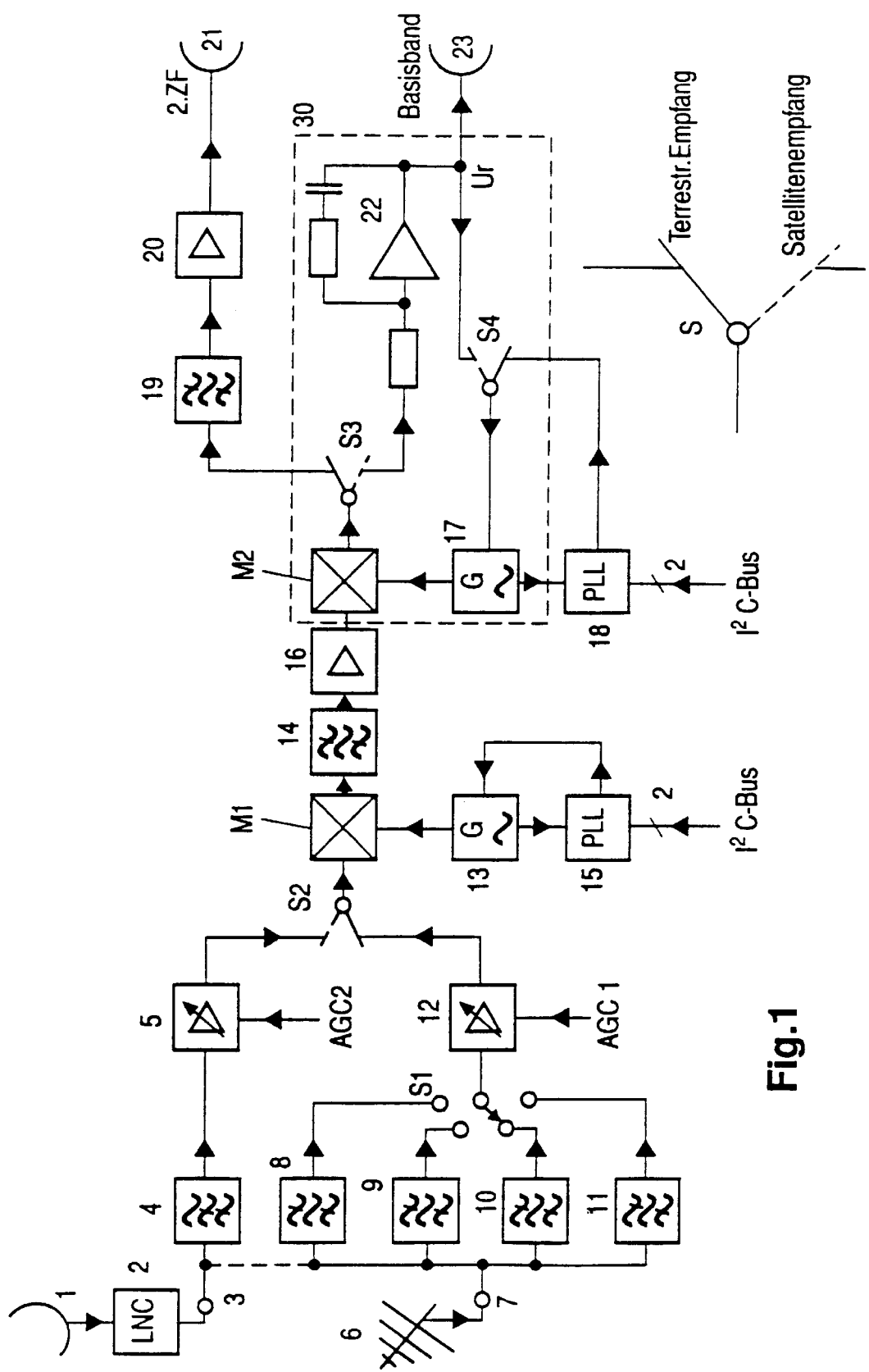

In the figure, the satellite receiving dish 1 supplies a signal at a frequency in the order of magnitude of 11 GHz, which is converted in the LNC (low noise converter) 2 to a frequency range of 950–2050 MHz. This signal passes via the antenna input 3 to the filter 4, which is tuned to this frequency range. This signal passes via the amplifier 5, which is controlled by the AGC2, to the first input of the changeover switch S2. The terrestrial antenna 6 supplies an antenna signal in the range from approximately 45 to 860 MHz, which passes to the antenna input 7. The input 7 is connected to the bandpass filter 8 which has a pass band of 45–100 MHz (VHF), to the bandpass filter 9 which has a pass band of 170–230 MHz (UHF), to the bandpass filter 10 which has a pass band of approximately 450 MHz, and to the bandpass filter 11 which has a pass band of 470–800 MHz. The changeover switch Si makes it possible to select each of the output signals of the bandpass filters 8–11 and to supply them to the amplifier 12, which is controlled by the AGC1 and whose output is connected to the second input of the changeover switch S2. The respective carrier at the output of the switch S2 is converted to a 1st IF in the first mixing stage M1, which is supplied from the mixing oscillator 13, which 1st IF is supplied to the IF filter 14. The mixing oscillator 13 is controlled by the PLL circuit 15 which is controlled in accordance with the respective tuning by an I²C bus. The 1st IF passes from the bandpass filter 14 via the amplifier 16 to the second mixing stage M2, to which the mixing oscillator 17 is connected which is controlled in a similar manner to the mixing oscillator 13 by the PLL circuit 18 for terrestrial reception, which PLL circuit 18, for its part, is also controlled by the I²C bus. The output of the mixing stage M2 is connected via the changeover switch S3 on the one hand to the bandpass filter 19 and via the IF amplifier 20 for the 2nd IF to the output 21 for the 2nd IF and, on the other hand, is connected via the integrator 22 to the output 23. The control input of the oscillator 17 can optionally be connected via the changeover switch S4 to the output of the PLL circuit 18 or to the output of the integrator 22.

The method of operation of this tuner is described in the following text, for terrestrial reception and satellite reception successively. The position of the changeover switches S1–S4 shown by solid lines in this case indicates terrestrial reception, and the position indicated by dashed lines that for satellite reception.

Terrestrial reception via the antenna 6

A double frequency conversion is carried out using the mixing stages M1 and M2. The stages M1, 13, 15 on the one hand and the stages M2, 17, 18 on the other hand then operate in a similar manner. In this case, the integrator 22 has no effect, as a result of the position of the switches S3 and S4. The 2nd IF appears at the output 21, with a video carrier at 38.9 MHz and an audio carrier at 33.4 MHz, which are supplied to the further signal processing.

Satellite reception via the dish 7

The mixing stage M2, the integrator 22 and the oscillator 17 now form a PLL circuit which is synchronized by the output signal of the amplifier 16 and operates as an FM demodulator. The mixing stage M2 in this case forms the phase comparison stage, the integrator 22 the low-pass filter or the filter elements, and the oscillator 17 the voltage-controlled oscillator, in general called a VCO, of the PLL circuit which forms the FM demodulator. The voltage Ur at the output of the integrator 22 is used as a control voltage for the frequency of the oscillator 17 in the sense that this oscillator 17 oscillates at the frequency of the frequency-modulated carrier from the output of the amplifier 16. Since the carrier is frequency-modulated by the amplifier 16, Ur at the output 23 at the same time represents the baseband signal, which comprises the video signal, the colour subcarrier and a plurality of audio carriers. The PLL circuit 18 then has no effect because the frequency of the oscillator 17 is governed only by Ur. In this operating mode, the oscillator 17 is tuned to the 1st IF, that is to say to the quiescent frequency of the carrier at the output of the amplifier 16. The mixing stage M2 thus does not now act as a mixing stage as in the case of terrestrial reception, but forms, in an advantageous manner, a component of the FM-PLL demodulator which is indicated by the dashed line 30.

The switches S1–S4 are preferably formed by switching diodes. In principle, they can also be designed as mechanical switch contacts. The overall illustrated circuit, apart from the filters themselves, can be designed as an integrated circuit.

Figure 2:
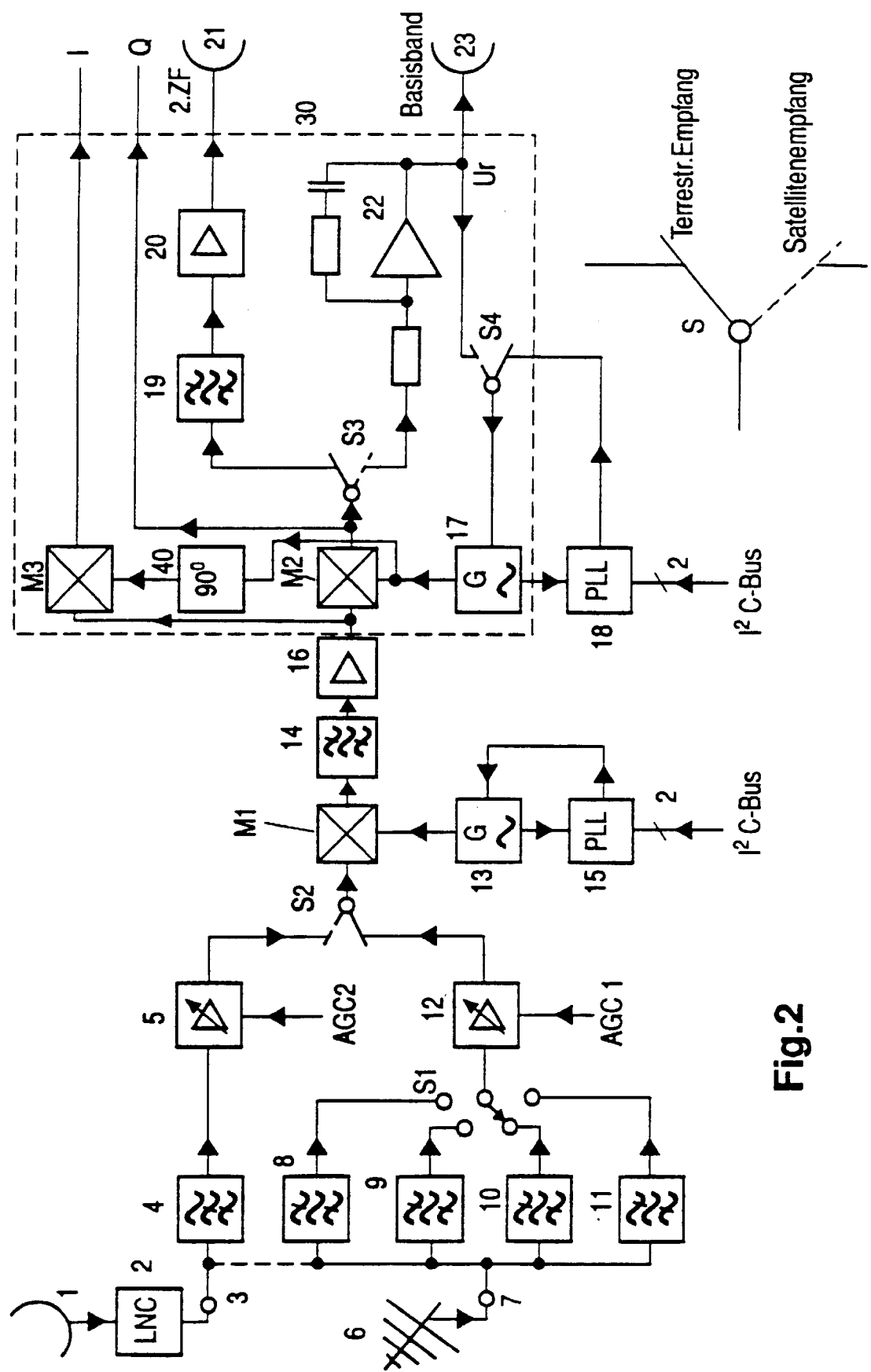

FIG. 2 illustrates a development of the invention. Using a circuit of such a design, terrestrial modulation signals and digital modulation signals received via satellite can be evaluated. For this purpose, the circuit according to FIG. 1 is supplemented by a 90° phase shifter 40 and a mixer M3.

A signal is derived from the oscillator 17 and is supplied via the 90° phase shifter 40 to the mixer M3. The oscillator signal is supplied on the one hand directly to the mixer M2 and on the other hand to the mixer M3, phase-shifted through 90°. The components I and Q then appear at the output of the mixers M3, M2. In the case of digital modulation, the components I and Q correspond to the real component and the imaginary component of a vector, I corresponding to the imaginary component and Q to the real component. The digital signal is thus available at the outputs I and Q.

I claim:

1. A television tuner for terrestrial reception and satellite reception comprising:

a first mixing stage for signal conversion to a first intermediate frequency: and second mixing stage for signal conversion to a second intermediate frequency, the second mixing stage being connected as a mixer for conversion to the second intermediate frequency for terrestrial reception and connected as a phase comparison stage of an FM-PLL demodulator for a satellite signal for satellite reception, an output of the second mixing stage coupled via a changeover switch to an input of a second IF stage for terrestrial reception and to an input of an integrator for satellite reception, and an output of the integrator being coupled to a control input of a mixing oscillator for the second mixing stage and to a terminal which supplies a baseband signal.

2. Tuner according to claim 1, wherein a control input of the mixing oscillator is connected via a second changeover switch to an output of a PLL circuit, the PLL circuit being controlled by the mixing oscillator and by an I²C bus, for terrestrial reception, the PLL circuit being coupled to output of the integrator for satellite reception.

3. Tuner according to claim 1, wherein the tuner has a first input for a satellite antenna signal whose frequency has been reduced, and has a second input for a terrestrial antenna signal.

4. Tuner according to claim 1, wherein the tuner has a first output for a second intermediate frequency of a terrestrial antenna signal and has a second output for a baseband signal of a satellite antenna signal.

5. A television tuner for terrestrial reception and satellite reception comprising:

a first mixing stage for signal conversion to a first intermediate frequency: and a second mixing stage for signal conversion to a second intermediate frequency, the second mixing stage being connected as a mixer for conversion to the second intermediate frequency for terrestrial reception and connected as a phase comparison stage of an FM-PLL demodulator for a satellite signal for satellite reception, and a mixing oscillator for the second mixing stage is additionally coupled via a 90° phase shifter to an input of a third mixer stage, the third mixer stage having another input for receiving an input signal of the second mixer stage.

6. Tuner according to claim 5, wherein an imaginary component of a vector of a digital modulation signal is present at an output of the third mixing stage and a real component of the vector of said digital modulation signal is present at an output of the second mixing stage.

* * * * *